(12) United States Patent
Fleskens et al.

(10) Patent No.: US 10,049,959 B2
(45) Date of Patent: Aug. 14, 2018

(54) THERMAL INTERFACE PAD MATERIAL WITH PERFORATED LINER

(75) Inventors: Bas Fleskens, Eindhoven (NL); Lambertus Adrianus Marinus De Jong, Son (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 938 days.

(21) Appl. No.: 14/006,438

(22) PCT Filed: Mar. 15, 2012

(86) PCT No.: PCT/IB2012/051244
§ 371 (c)(1),
(2), (4) Date: Sep. 20, 2013

(87) PCT Pub. No.: WO2012/131519
PCT Pub. Date: Oct. 4, 2012

(65) Prior Publication Data
US 2014/0008050 A1    Jan. 9, 2014

(30) Foreign Application Priority Data
Mar. 25, 2011 (EP) .................................. 11159691

(51) Int. Cl.
*H01L 23/42* (2006.01)
*H01L 23/373* (2006.01)
(Continued)

(52) U.S. Cl.
CPC .......... *H01L 23/373* (2013.01); *F21V 17/002* (2013.01); *F28F 3/00* (2013.01);
(Continued)

(58) Field of Classification Search
CPC .......... F28F 2013/005; F28F 2013/006; H01L 2023/4068
(Continued)

(56) References Cited

U.S. PATENT DOCUMENTS

| | | | |
|---|---|---|---|
| 4,693,303 A | 9/1987 | Okada | |
| 5,863,814 A | 1/1999 | Alcoe et al. | |

(Continued)

FOREIGN PATENT DOCUMENTS

| | | |
|---|---|---|
| CN | 101000938 A | 7/2007 |
| JP | 2011114197 A | 6/2011 |

*Primary Examiner* — Allen Flanigan
(74) *Attorney, Agent, or Firm* — Akarsh P. Belagodu

(57) ABSTRACT

This invention relates to a thermal interface device (206) arranged to provide a thermal coupling interface between a heat-generating unit (202) and a heat-removing unit (204), comprising a liner layer (210), which has opposite first and second surfaces (218,220), at least the first surface being a slide surface, and which is provided with multiple perforations (212); and a thermal connection layer (208), which is engaged with the liner layer at the second surface (220) thereof, and which is one of elastically and inelastically deformable. The thermal interface device has an idle state where the perforations are open, and an active state where the perforations are filled with a part of the thermal connection layer. The thermal connection layer is arranged to be deformed by the thermal interface device being subjected to a compression force exceeding a deformation threshold, and thereby to fill the perforations.

13 Claims, 4 Drawing Sheets

(51) Int. Cl.
    *H01L 23/433*     (2006.01)
    *F28F 3/00*     (2006.01)
    *F21V 17/00*     (2006.01)

(52) U.S. Cl.
    CPC .......... *H01L 23/3737* (2013.01); *H01L 23/42* (2013.01); *H01L 23/433* (2013.01); *H01L 2924/0002* (2013.01)

(58) Field of Classification Search
    USPC .......................................................... 165/185
    See application file for complete search history.

(56) References Cited

U.S. PATENT DOCUMENTS

| | | | |
|---|---|---|---|
| 6,064,573 A | 5/2000 | Morton | |
| 6,223,815 B1* | 5/2001 | Shibasaki | F28F 13/00 |
| | | | 165/185 |
| 7,200,006 B2 | 4/2007 | Farrow et al. | |
| 7,646,608 B2 | 1/2010 | Thompson et al. | |
| 7,694,719 B2 | 4/2010 | Furman et al. | |
| 2004/0021981 A1 | 2/2004 | Morita et al. | |
| 2007/0256810 A1 | 11/2007 | Di Stefano et al. | |
| 2008/0290504 A1 | 11/2008 | Karavakis et al. | |
| 2009/0012249 A1 | 5/2009 | Martin et al. | |
| 2009/0154166 A1* | 6/2009 | Zhang et al. | F21K 9/00 |
| | | | 362/294 |
| 2009/0154180 A1* | 6/2009 | Cho et al. | F21S 48/1159 |
| | | | 362/459 |
| 2009/0255659 A1* | 10/2009 | Xu et al. | H01L 23/367 |
| | | | 165/185 |
| 2010/0271786 A1* | 10/2010 | Yeh et al. | H01L 23/4093 |
| | | | 361/720 |
| 2012/0061127 A1* | 3/2012 | Fields et al. | H01L 23/373 |
| | | | 174/252 |

\* cited by examiner

THERMAL INTERFACE PAD MATERIAL WITH PERFORATED LINER

FIELD OF THE INVENTION

The present invention relates to a thermal interface device, arranged to provide a thermal coupling interface between a heat-generating unit and a heat-removing unit.

BACKGROUND OF THE INVENTION

The design of thermal interface devices has been driven by thermal performance and thus the thermally conducting materials used in the thermal interface device, such as paste, grease, phase change materials, etc., are designed to have very good wetting capabilities and a high bulk conductivity. The high bulk conductivity is realized by the choice of material, and the good wetting capabilities are obtained by the choice of appropriate softness and surface tackiness of the material. An example of a known thermal interface device is shown in US patent application 2004/021981. This prior art device comprises a thermal membrane, which is patterned with holes, and a highly thermally conducting paste, which has been received in the holes. However, in some applications it would be desired to have a thermal interface device which is slideable on at least one of its opposite surfaces facing the heat-generating unit and the heat-removing unit, respectively.

SUMMARY OF THE INVENTION

It is an object of the present invention to provide a thermal interface device that alleviates the above-mentioned drawbacks of the prior art.

This object is achieved by a thermal interface device according to the present invention as defined in claim 1, and by a method of assembling an apparatus as defined in claim 9.

The invention is based on an insight that it is possible to combine slideability and good wetting capabilities by providing a thermal interface device which has an idle state of good slideability and an active state of good wetting, the transition from the idle state to the active state being performed by subjecting the thermal interface device to compression.

Thus, in accordance with an aspect of the present invention, there is provided a thermal interface device arranged to provide a thermal coupling interface between a heat-generating unit and a heat-removing unit, comprising:

a liner layer, which has opposite first and second surfaces, at least the first surface being a slide surface, and which is provided with multiple perforations; and a thermal connection layer, which is engaged with the liner layer at the second surface thereof, and which is one of elastically and inelastically deformable. The thermal interface device has an idle state where the perforations are open, and an active state where the perforations are filled with a part of the thermal connection layer. The thermal connection layer is arranged to be deformed by the thermal interface device being subjected to a compression force exceeding a deformation threshold, and thereby to fill the perforations. In accordance with another aspect of the invention there is provided a method of assembling an apparatus comprising:

providing a heat-generating unit;
providing a heat-removing unit;
providing a thermal interface device comprising a liner layer, which has opposite first and second surfaces, at least the first surface being a slide surface, and which is provided with multiple perforations; and a thermal connection layer, which is engaged with the liner layer at the second surface thereof, and which is one of elastically and inelastically deformable;

assembling the apparatus by assembling the thermal interface device, the heat-generating unit, and the heat-removing unit such that the thermal interface is positioned between the heat-generating unit and the heat-removing unit, engaging the first surface of the liner layer with an engagement surface of one of the heat-generating unit and the heat-removing units, and engaging the opposite surface of the thermal interface device with an engagement surface of the other one of the heat-generating unit and the heat-removing unit;

compressing the apparatus, and thereby the thermal interface device, by a compression force exceeding a deformation threshold of the connection layer, thereby forcing a part of the connection layer through the perforations into engagement with a the same engagement surface that the first surface of the liner layer is engaged with.

The two-state thermal interface device has the advantages of first being slideable, due to the slide surface of the liner, during the assembling thereby being easy to position correctly, and having a good wetting capability after compression due to the material of the thermal connection layer contacting the surface of the heat-removing unit through the perforations of the liner. For the case that the thermal connection layer is elastically deformable, an additional advantage is that the thermal interface device becomes slideable again as soon as the compression force is removed.

In accordance with an embodiment of the thermal interface device, it is provided with liner layers on opposite sides of the thermal connection layer, thereby further increasing exchangeability and the freedom of assembling the thermal interface device with the heat-generating and heat-removing units.

In accordance with an embodiment of the thermal interface device, the liner layer is provided with elongated perforations. Thereby the perforations are adaptable to a preferred sliding direction.

In accordance with an embodiment of the thermal interface device, the interface device constitutes a circular plate, which is adapted for specific applications of heat-generating and heat-removing units having circular surfaces engaging with the thermal interface device.

In accordance with another aspect of the present invention there is provided an apparatus comprising a heat-generating unit, a heat-removing unit and a thermal interface device as defined above. The thermal interface device is arranged between the heat-generating unit and the heat-removing unit. The apparatus is subjected to a compression force pressing the heat-generating unit and the heat-removing unit towards each other, wherein the thermal connection layer of the interface device comprises protrusions extending through the perforations of the liner layer thereby engaging with an engagement surface of either the heat-removing unit or the heat-generating unit. The thermal connection layer has been deformed by the compression force, which has forced material of the thermal connection layer to fill the perforations, thereby forming the protrusions.

These and other aspects, features, and advantages of the invention will be apparent from and elucidated with reference to the embodiments described hereinafter.

BRIEF DESCRIPTION OF THE DRAWINGS

The invention will now be described in more detail and with reference to the appended drawings in which.

DESCRIPTION OF PREFERRED EMBODIMENTS

Figure 1:
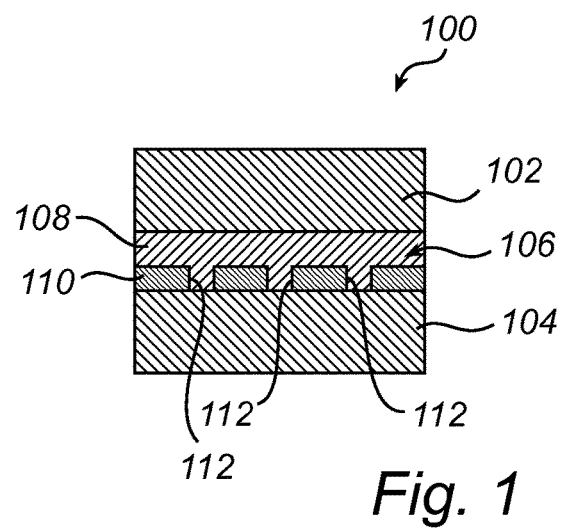
FIG. 1 shows a schematic cross-sectional view of an apparatus which comprises an embodiment of a thermal interface device according to the present invention.

According to a general example of an apparatus comprising an embodiment of the thermal interface device according to the present invention, as shown in FIG. 1, the apparatus 100 comprises a heat-generating unit 102, a heat-removing unit 104, and an intermediate thermal interface device 106. The thermal interface device 106 is plate shaped and consists of a thermal connection layer 108 and a liner layer 110 arranged on top of each other. The thermal connection layer 108, which is sometimes referred to as a pad, is engaged with the heat-generating unit 102, and the liner layer 110 is engaged with the heat-removing unit 104. The liner layer 110 is provided with perforations 112, and protrusions of the thermal connection layer 108 extend through the perforations 112. In the apparatus 100 the thermal interface device 106 is in an active state, where it is compressed. In this active state the material of the thermal connection layer 108 extends through the perforations 112 and is engaged with the surface of the heat-removing unit 104.

Figure 2:
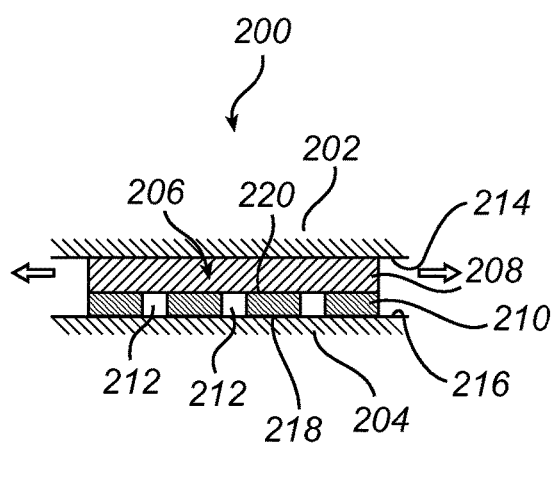
FIGS. 2 and 3 are cross-sectional views of an embodiment of the thermal interface device in respective idle and active states.
Figure 3:
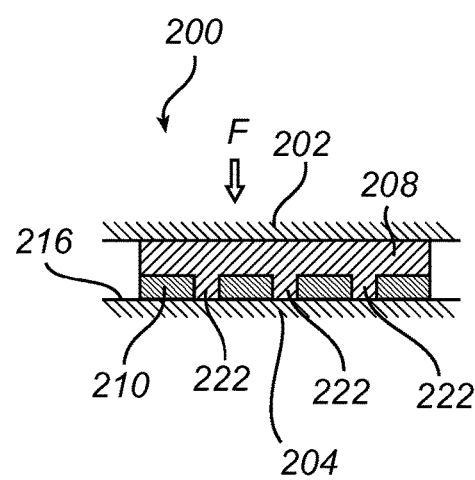

Referring now to FIGS. 2 and 3 as well, according to an embodiment of the method of assembling an apparatus according to this invention, first a heat-generating unit 202, a heat-removing unit 204, and a thermal interface unit 206 are provided, the thermal interface device 206 having a thermal connection layer 208 and a liner layer 210. The liner layer 210 comprises opposite first and second surfaces 218, 220, at least the first surface 218 being a slide surface, and is provided with multiple perforations 212. The thermal connection layer 208 is engaged with the liner layer 210 at the second surface 220 thereof, and is one of elastically and inelastically deformable. Then the apparatus is assembled by assembling the thermal interface device 206, the heat-generating unit 202, and the heat-removing unit 204 such that the thermal interface 206 is positioned between the heat-generating unit 202 and the heat-removing unit 204, the liner layer 210 abutting the heat-removing unit 204, and consequently, the thermal connection layer 208 abutting the heat-generating unit 202 with its first surface 218. According to an embodiment of the method, the thermal connection layer, which is made of a material of good wetting capability, engages with the heat-generating unit 202. Due to the slide surface 218 of the liner layer 210 a sub-assembly of the heat-generating unit 202 and the thermal interface device 206 is movable relative to the heat-removing unit 204, as indicated by arrows in FIG. 2. Thus, the position of the sub-assembly relative to the heat-removing unit 204 is adjustable. This is advantageous for example when there is no vertical freedom of positioning, i.e. the sub-assembly has to be moved vertically into contact with the heat-removing unit and then moved laterally into its final position. For instance some other part prevents the sub-assembly from being correctly positioned while placing it on the heat-removing unit 204 but there is space to move it laterally after being placed on the surface of the heat-removing unit 204. In this case it is preferable to start with assembling the heat-generating unit 202 and the thermal interface device 206, which in common constitute a sub-assembly, and proceed with arranging the sub-assembly at the heat-removing unit 204. Then a compression force, shown by arrow F in FIG. 3, is applied on the apparatus 200. The compression force exceeds a deformation threshold of the connection layer 208, and forces a part of the connection layer 208 through the perforations 212 into engagement with a surface 216 of the heat-removing unit 204. The connection layer material extending through the perforations, or holes, 212 could be regarded as protrusions of the thermal connection layer 208. Due to the tackiness of the material of the thermal connection layer 208 the thermal interface device 206 is no longer easily movable with respect to the heat-removing unit 204, and a good thermal conduction from the heat-generating unit 202 to the heat-removing unit is obtained.

Figure 8:
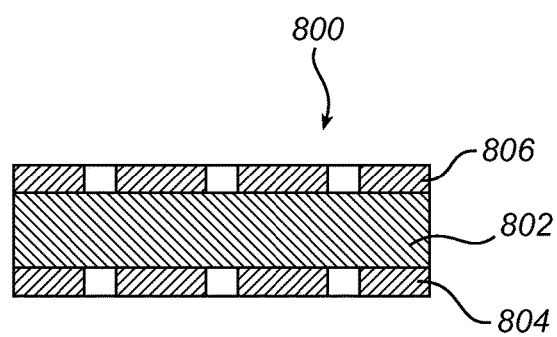
FIG. 8 is a schematic cross-sectional view of an embodiment of the thermal interface device.

It should be noted that in some applications the thermal interface device 206 is mounted the other way around, i.e. the liner layer 210 is engaged with the surface of the heat-generating unit 202. Furthermore, according to another embodiment of the thermal interface device is comprises two liner layers mounted on opposite sides of the thermal connection layer, as will be described below in conjunction with FIG. 8.

The thermal connection layer 208 is relatively soft and has a relatively low deformation threshold, while being either elastically or inelastically deformable. There are many materials already available on the market, and a person skilled in the art has knowledge of those. Some examples of elastically, i.e. temporarily, deformable materials are so called pad materials, like the T-FLEX HR400 and T-FLEX 200T V0 series provided by Laird Technologies Inc, and Gap Pad V0® Ultimate provided by Bergquist Company Inc. Some examples of inelastically deformable materials, i.e. materials subjected to a permanent deformation, are pad materials like Gap Pad VO Ultra Soft and Gap Pad xxxx Sxx "S-class" series provided by Bergquist Company Inc, phase change materials like the High Flow series without carrier provided by Bergquist, and thermal paste or grease like the TC series provided by Dow Corning Corporation and thermal compounds provided by Arctic Silver Inc.

It is preferable to use an elastically deformable thermal connection layer in order to achieve an improved exchangeability of the heat-generating unit 202. Some examples of apparatuses where an improved exchangeability is desirable are lighting devices, in particular LED (light emitting diode) lighting devices, wherein the thermal interface device is arranged between the light source, such as a LED PCB, and a heat sink or another kind of light source holder, general applications where the thermal interface device is arranged between a CPU and a heat sink, laser apparatuses, etc. Typical LED lighting devices are the Twist Module provided by Philips, the Sprocket LED light engine provided by Journee Lighting, automotive front lighting, and street light modules. Some examples of liner materials are polyimide, aluminum foil, PEN film, and graphite foil. When the heat-generating unit 202 is to be removed, the compression force F is removed, whereby the protrusions of the thermal connection layer 208 becomes retracted and the thermal connection layer 208 recovers its original plate shape. Then the thermal interface device 206 is again slideable on the surface of the heat-removing unit 204, and the sub-assembly of the thermal interface device 206 and the heat-generating unit 202 is easily removable. As regards the application of the compression force, typically it is applied after having put the parts in place, as exemplified above. However, it is a possible alternative to apply, at least gradually, the compression force already during placement of the parts in position.

Figure 4:
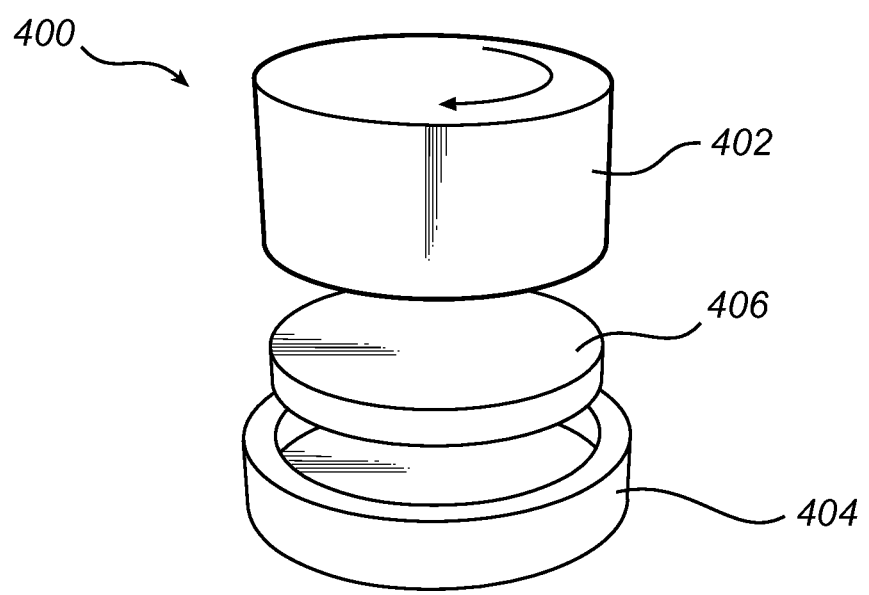
FIG. 4 schematically shows an exploded view of an apparatus which comprises an embodiment of the thermal interface device.

According to another embodiment of the thermal interface device 406 as shown in FIG. 4, it has a circular plate shape and is arranged in an apparatus 400 comprising a generally cylindrical heat-generation unit 402, and a generally cylindrical heat-removing unit 404. The thermal interface device 406 is mounted between the heat-generating and heat-removing units 402, 404. A practical example of such an apparatus is a lighting device, and more particularly LED lamp, called Fortimo Twistable LED TDLM, provided by Koninklijke Philips Electronics N.V., which would benefit from employing the thermal interface device 406 according to this embodiment. The heat-generating unit 402 comprises a LED light source, and the heat-removing unit 404 is a holder. Like the above embodiments this embodiment of the thermal interface device 406 has a thermal connection layer and a liner layer, although not shown in detail in FIG. 4. In this apparatus, the heat-generating unit 402 is rotated into engagement with the heat-removing unit 404, thereby making use of the slide surface of the liner layer during the rotation. In addition, while rotating into position, a compression force rises, in order to keep the parts together in a mounted state, causing the material of the thermal connection layer to filling the perforations of the liner layer and contacting the surface of the heat-removing unit 404, as explained in detail above.

Figure 5:
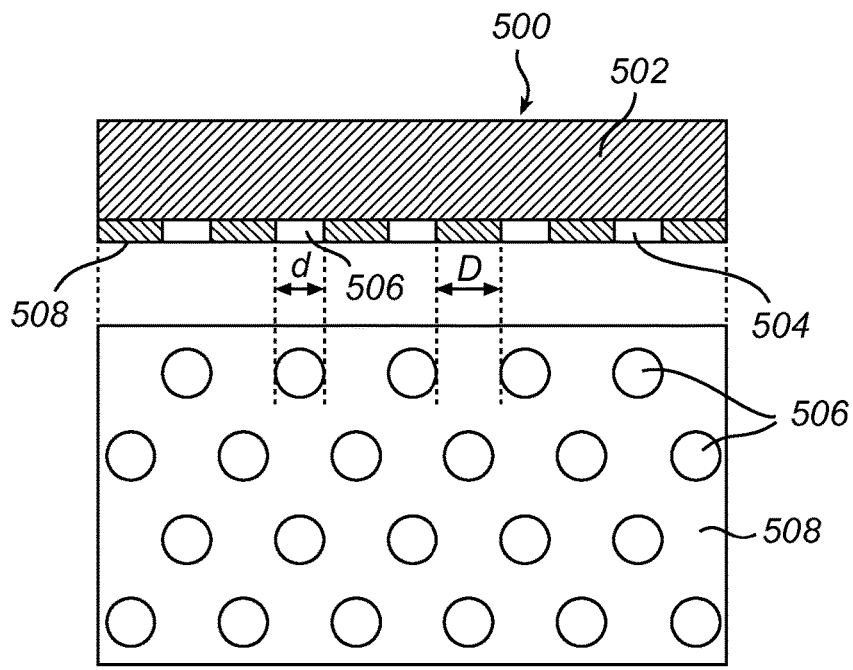
FIGS. 5-7 illustrate embodiments of the thermal interface device having different kinds of perforations in a liner layer thereof.
Figure 6:
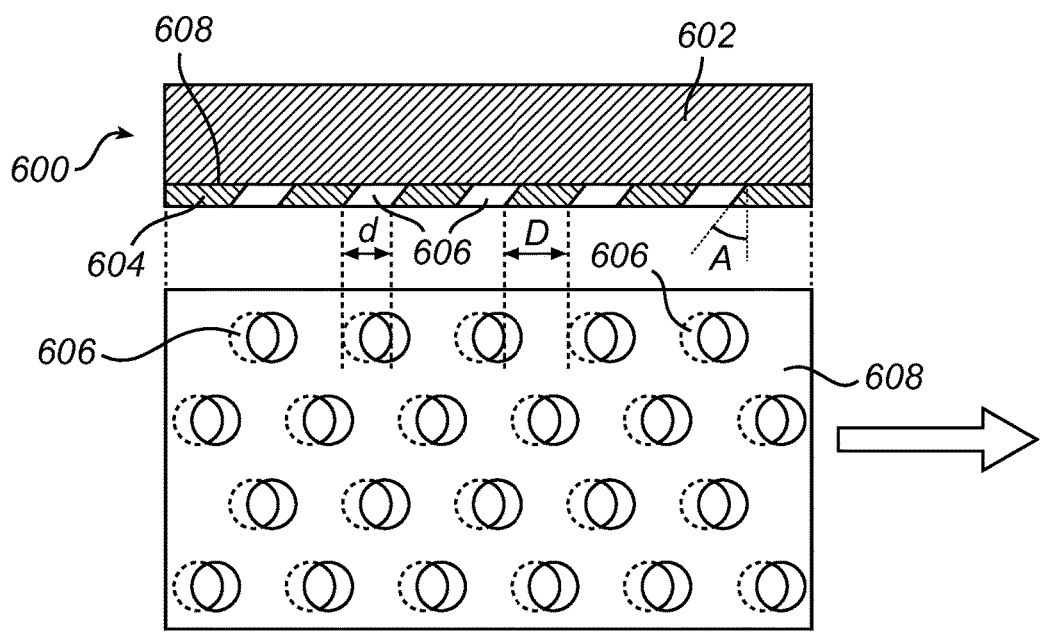
Figure 7:
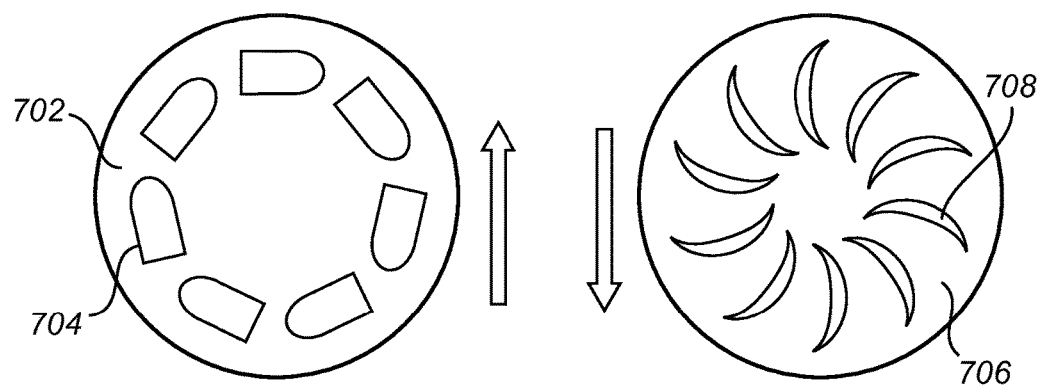

There are many different alternatives of perforation shapes, as shown in FIGS. 5-7. FIGS. 5 and 6 each show a cross-sectional view of a respective embodiment of the thermal interface device 500, 600, and a view perpendicular to the cross-sectional view and showing the first surface 508, 608 of the liner layer 504, 604. According to one of the embodiments, the perforations of the liner layer 500 are cylindrical holes 506 evenly spread across the liner layer 504 and extending straight through the liner layer 504. A typical diameter d of the hole is one or a few millimeters, and a typical distance D between two adjacent holes is about one or several times the diameter.

According to another embodiment, as shown in FIG. 6, the thermal interface device 600 includes a thermal connection layer 602 and a liner layer 604, where the perforations of the liner layer 604 are also cylindrical holes 606 but the holes 606 extend obliquely through the liner layer 604. Typically the angle A between the normal of the main plane of the liner layer 604 and a central axis of the hole 606 is larger than 0 degrees and up to about 45 degrees. Thus, seen from the first surface, or slide surface 608, of the liner layer 604 the perforations 606 are approximately circular or elliptical.

According to further embodiments of the liner layer, as shown in FIG. 7, the perforations can be elongate in different ways. These embodiments are useful for circular liner layers 702, 706, which are rotatably sliding. In one example, the perforations 704 are arranged in a circle around the liner layer 702, and they have a cross-sectional shape of a rectangle with one arc shaped short side. The straight short side constitutes a front end during rotation. In the other example the perforations 708 are banana shaped in cross-section. They are arranged in a circle, and their elongation is radial.

According to another embodiment of the thermal interface device 800, it comprises two liner layers 804, 806, oppositely arranged on either side of the thermal connection layer 802. When subjected to a compression force, material of the thermal connection layer 802 fills the perforations of the liner layers 804, 806.

It should be noted that a basic factor that often is important is the thickness of the thermal interface device. It should be chosen to be thick enough to compensate for uneven surfaces of the heat-generating and heat-removing units, and to enable the filling of the perforations. Just to give a hint about the magnitude, without intending to introduce any limitations of the scope of the present invention, a typical thickness of the liner layer is between about 10 microns to about 50 microns. A typical thickness of the thermal connection layer is: in case of a pad material, 0.2 to 1 mm; in case of a phase change material, 25 to 250 microns; and, in case of a thermal paste or grease, 25 to 100 microns. For sake of clarity, a phase change material is a material that is solid at room temperature and undergo a phase change to a liquid like state at an elevated temperature, typically around 50-60° C.

Above, embodiments of the thermal interface device according to the present invention as defined in the appended claims have been described. These should be seen as merely non-limiting examples. As understood by a person skilled in the art, many modifications and alternative embodiments are possible within the scope of the invention.

It is to be noted, that for the purposes of this application, and in particular with regard to the appended claims, the word "comprising" does not exclude other elements or steps, that the word "a" or "an", does not exclude a plurality, which per se will be apparent to a person skilled in the art.

The invention claimed is:

1. An apparatus, comprising: a heat-generating unit; a heat-removing unit; and a thermal interface device arranged to provide a thermal coupling interface between the heat-generating unit and the heat-removing unit, the thermal interface device comprising: a first liner layer, which has opposite first and second surfaces, at least the first surface being slideable relative to the heat-generating unit or the heat-removing unit, the first liner layer comprising multiple perforations extending between the first and second surfaces; and a thermal connection layer, which is engaged with the liner layer at the second surface thereof, and which is elastically deformable, and exhibits an uncompressed shape in the absence of an applied compression force; wherein the thermal interface device has an idle state where the multiple perforations are open, and an active state where the multiple perforations are filled with a part of the thermal connection layer, wherein the thermal connection layer is arranged to be deformed by the thermal interface device being subjected to a compression force exceeding a deformation threshold, and thereby to fill the multiple perforations, and wherein the thermal connection layer is configured to recover its original uncompressed shape when the compression force is removed, wherein, in the idle state, the thermal interface device has a first configuration in which the thermal interface device is configured to form a sub-assembly with the heat-generating unit or the heat-removing unit, wherein the sub-assembly is slideable laterally or rotationally relative to the other of the heat-generating unit or the heat-removing unit, wherein, in the active state, the thermal interface device has a second configuration in which material of the thermal connection layer extends through the multiple perforations and engages with a surface of the heat-generating unit or the heat-removing unit, and wherein the thermal interface device is configured to transition back and forth between the first and second configurations.

2. The apparatus according to claim 1, comprising a second liner layer engaged with the thermal connection layer opposite to the first liner layer.

3. The apparatus according to claim 1, wherein the first liner layer comprises elongated perforations.

4. The apparatus according to claim 3, wherein the interface device constitutes a circular plate.

5. The apparatus according to claim 4, wherein the perforations are arranged in at least one ring concentric with the peripheral of the thermal interface device.

6. The apparatus according to claim 5, wherein the perforations extend obliquely from the first surface to the second surface.

7. The apparatus according to claim 1, wherein the thermal interface device is arranged between the heat-generating unit and the heat-removing unit, wherein the apparatus is subjected to a compression force (F) pressing the heat-generating unit and the heat-removing unit towards each other, wherein the thermal connection layer of the interface device comprises protrusions extending through the perforations of the liner layer thereby engaging with an engagement surface of either the heat-removing unit or the heat-generating unit.

8. The apparatus according to claim 7, wherein the heat-generating unit is a light emitting diode lighting device.

9. An apparatus produced by a process comprising the steps of:
   providing a heat-generating unit;
   providing a heat-removing unit;
   providing a plate-shaped liner layer having a plurality of perforations extending between first and second opposite liner layer surfaces;
   arranging a thermal connection layer having first and second opposite connection layer surfaces on top of the plate-shaped liner layer such that the first connection layer surface is arranged on top of the first liner layer surface;
   positioning the plate-shaped liner layer and the thermal connection layer between the heat-generating unit and the heat-removing unit such that, in an idle state, the second liner layer surface is engaged with an engagement surface of the heat-generating unit or the heat-removing unit and the second connection layer surface is engaged with the other one of the heat-generating unit and the heat-removing unit, the plurality of perforations are open, and the first connection layer surface that is arranged on top of the first liner layer surface is arranged between the second liner layer surface and the second connection layer surface; and
   compressing the apparatus by a compression force exceeding a deformation threshold of the thermal connection layer, thereby forcing, in an active state, a part of the thermal connection layer through the plurality of perforations into engagement with the engagement surface that is engaged with the second liner layer surface;
   removing the compression force from the apparatus, thereby causing the part of the thermal connection layer to retract from engagement with the engagement surface.

10. The apparatus according to claim 9, wherein the first and second opposite liner layer surfaces are arranged a distance from the second connection layer surface when the apparatus is compressed.

11. The apparatus according to claim 9, wherein the second liner layer surface is slideable relative to the heat-generating unit or the heat-removing unit in the idle state.

12. The apparatus according to claim 9, wherein providing the heat-generating unit comprises providing a light source and providing the heat-removing unit comprises providing a holder for receiving the light source.

13. The apparatus according to claim 12, wherein positioning the plate-shaped liner layer and the thermal connection layer between the heat-generating unit and the heat-removing unit comprises rotatably engaging the light source with the holder such that at least a portion of the holder surrounds the light source.

* * * * *